United States Patent
Sunayama et al.

(10) Patent No.: US 8,119,524 B2
(45) Date of Patent: Feb. 21, 2012

(54) METHOD OF MANUFACTURING SEMICONDUCTOR DEVICE

(75) Inventors: Michie Sunayama, Yokohama (JP); Noriyoshi Shimizu, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/967,650

(22) Filed: Dec. 14, 2010

(65) Prior Publication Data

US 2011/0151661 A1    Jun. 23, 2011

(30) Foreign Application Priority Data

Dec. 21, 2009    (JP) ................. 2009-289582

(51) Int. Cl.
*H01L 21/4763*    (2006.01)

(52) U.S. Cl. ........ 438/643; 438/618; 438/627; 438/625; 438/622; 438/597; 438/628; 438/635; 438/644; 438/660

(58) Field of Classification Search ............... 438/643, 438/627, 660
See application file for complete search history.

(56) References Cited

U.S. PATENT DOCUMENTS

| 2002/0115292 A1 * | 8/2002 | Andricacos et al. | 438/687 |
| 2005/0218519 A1 | 10/2005 | Koike et al. | |
| 2007/0048931 A1 * | 3/2007 | Shimizu et al. | 438/243 |

FOREIGN PATENT DOCUMENTS

| JP | 2005-277390 A | 10/2005 |
| JP | 2008-205177 A | 9/2008 |

OTHER PUBLICATIONS

Kudo, H. et al. "Copper Wiring Encapsulation at Semi-Global Level to Enhance Wiring and Dielectric Reliabilities for Next-Generation Technology Nodes," Interconnect Technology Conference 2009 IEEE International , Jun. 1-3, 2009, pp. 188-190.

Kudo, H. et al. "Further Enhancement of Electro-migration Resistance by Combination of Self-aligned Barrier and Copper Wiring EncapsulationTechniques for 32-nm Nodes and Beyond," Interconnect Technology Conference 2008, Jun. 1-4, 2008, pp. 117-119.

Haneda, M. et al. "Self-Restored Barrier using Cu-Mn alloy," ADMETA, 2007, vol. 124, pp. 27-28.

* cited by examiner

*Primary Examiner* — Ha Tran T Nguyen
*Assistant Examiner* — Aaron Dehne
(74) *Attorney, Agent, or Firm* — Fujitsu Patent Center

(57) ABSTRACT

A first film containing a first metal material having a diffusion preventing function for copper, a second film containing oxygen-contained copper film, a third film containing copper and a second metal material which exhibits a diffusion preventing function for copper by bonding with oxygen, and a fourth film of copper as the main material are formed in an opening formed in an insulating film, and then a barrier layer containing the first metal material, the second metal material and oxygen is formed by thermal processing between the insulating film and the fourth film.

12 Claims, 7 Drawing Sheets

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2009-289582, filed on Dec. 21, 2009, the entire contents of which are incorporated herein by reference.

FIELD

The embodiments discussed herein are related to a method of manufacturing a semiconductor device, more specifically, a semiconductor device including a copper interconnection.

BACKGROUND

In the semiconductor device including a copper interconnection, for decreasing a signal delay in the multi-level interconnection structure, low dielectric constant film is used as the inter-layer insulating film. As the barrier film for preventing the diffusion of copper into the inter-layer insulating film, metal film containing refractory metal, such as tantalum, titanium or others, or its nitride is used.

However, as the interconnection trench and the via-hole are downsized and the dielectric constant of the inter-layer insulating films is lowered due to downsizing of the semiconductor device, it is difficult to ensure the reliability of the barrier film by the degradation of the barrier ability of the barrier film under the influence of the degradation of the coverage of the barrier film at the trench part and the oxidation of the barrier film by the low dielectric constant insulating film. In such background, recently, as a technique for improving the reliability of the copper interconnection, the technique of forming the barrier film of the alloy of copper as the base metal and manganese (Mn) (Mn alloy material) is proposed. In the technique of forming the new barrier compound film of the Mn alloy material, an additive alloy element (Mn) is introduced in an interconnection layer, and thermal processing is made, whereby a layer having the diffusion preventing function is formed at the interface between the conductive part and the inter-layer insulating film by self-restore or self-alignment. Thus, the adhesion and barrier ability at the interface are ensured, and the reliability of the copper interconnection can be improved.

The following are examples of related: Japanese Laid-open Patent Publication No. 2005-277390; Japanese Laid-open Patent Publication No. 2008-205177; Haneda et al., "Self-Restored Barrier using Cu—Mn Alloy", ADMETA, Vol. 124, pp. 27-28, 2007; Kudo et al., "Further Enhancement of Electro-migration Resistance by Combination of Self-aligned Barrier and Copper Wiring Encapsulation Techniques for 32-nm Nodes and Beyond", International Interconnect Technology Conference, 2008, pp. 117-119; and Kudo et al., "Copper Wiring Encapsulation at Semi-Global Level to Enhance Wiring and Dielectric Reliabilities for Next-Generation Technology Nodes", International Interconnect Technology Conference, 2009, pp. 188-190.

Mn added to the interconnection layer diffuses in the interconnection layer and is consumed out of the interconnection layer by the reaction of forming at the interface with the inter-layer insulating film a composite barrier compound layer containing a refractory metal material of the barrier layer, oxygen from the inter-layer insulating film, and the Mn. However, by this technique of adding Mn in the interconnection layer, excessive Mn which does not contribute to the reaction of forming the composite barrier compound layer resides in the interconnection or the via to resultantly increase the interconnection resistance and the contact resistance.

SUMMARY

According to one aspect of an embodiment, there is provided a method of manufacturing a semiconductor device including forming an insulating film above a semiconductor substrate, forming an opening in the insulating film, forming a first film containing a first metal material containing at least one kind of an element selected from the group consisting of Ta, Ti, Co, Zr and Ru above an inside wall and a bottom of the opening in the insulating film, forming a second film including an oxygen-contained copper film above the first film, forming a third film containing copper and a second metal material containing at least one kind of an element selected from the group consisting of Mn, Ti and Al above the second film, forming above the third film a fourth film containing copper, filling the opening with the first film, the second film and the third film formed in, and removing the fourth film, the third film, the second film and the first film above the insulating film to form an interconnection layer buried in the opening, and further including after forming the fourth film, forming a barrier layer containing the first metal material, the second metal material and oxygen between the insulating film and the fourth film by thermal processing.

According to another aspect of an embodiment, there is provided a method of manufacturing a semiconductor device including forming an insulating film above a semiconductor substrate, forming an opening in the insulating film, forming a first film containing a first metal material having a diffusion preventing function for copper above an inside wall and a bottom of the opening in the insulating film, forming a second film including an oxygen-contained copper film above the first film, forming a third film containing copper and a second metal material which exhibits a diffusion preventing function for copper by bonding with oxygen above the second film, forming above the third film a fourth film containing copper, filling the opening with the first film, the second film and the third film formed in, and removing the fourth film, the third film, the second film and the first film above the insulating film to form an interconnection layer buried in the opening, and further including after forming the fourth film, forming a barrier layer containing the first metal material, the second metal material and oxygen between the insulating film and the fourth film by thermal processing.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

A method of manufacturing a semiconductor device according to a first embodiment will be described with reference to FIGS. 1 to 6B.

Figure 1:
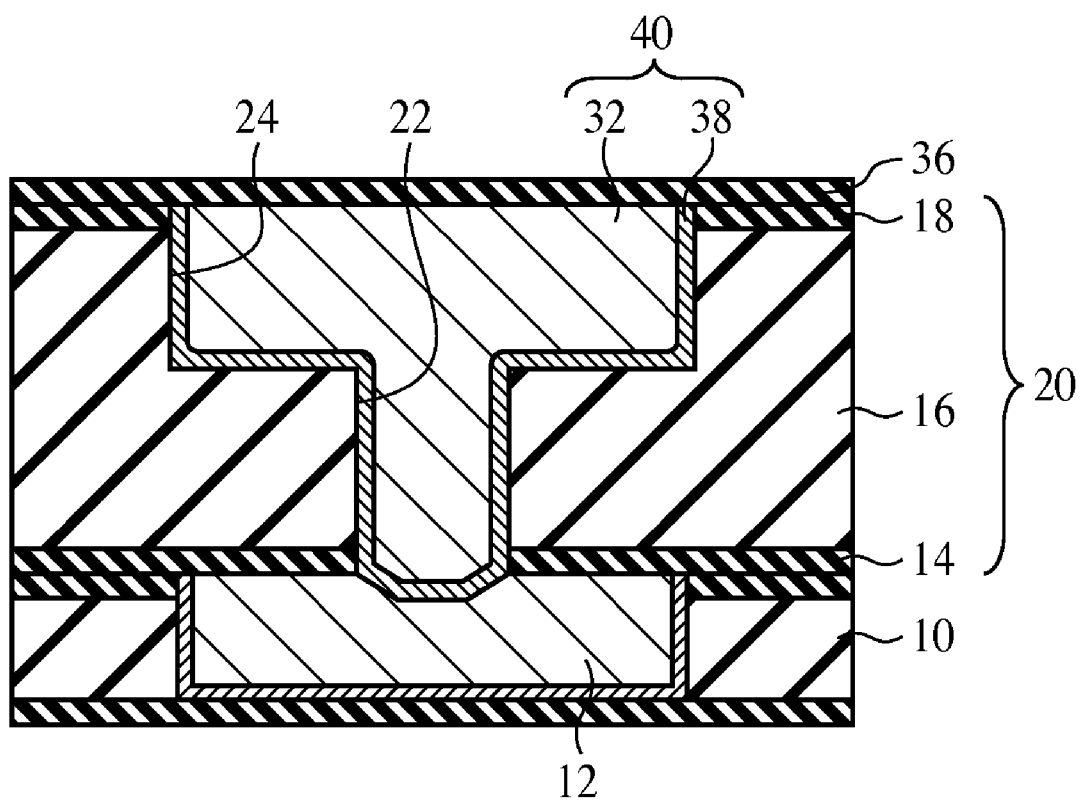
FIG. 1 is a diagrammatic cross-sectional view illustrating a structure of a semiconductor device according to a first embodiment.
Figure 5A:
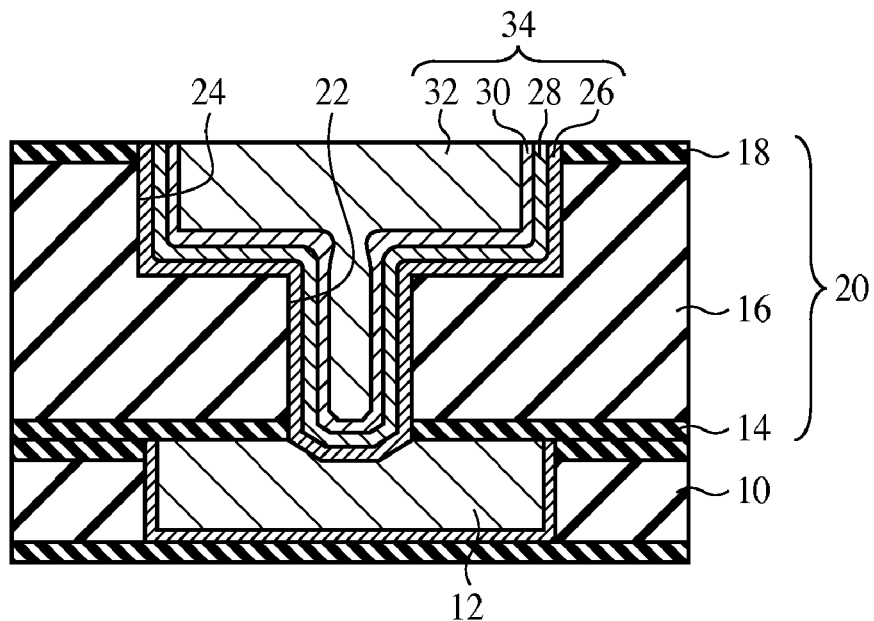
Figure 5B:
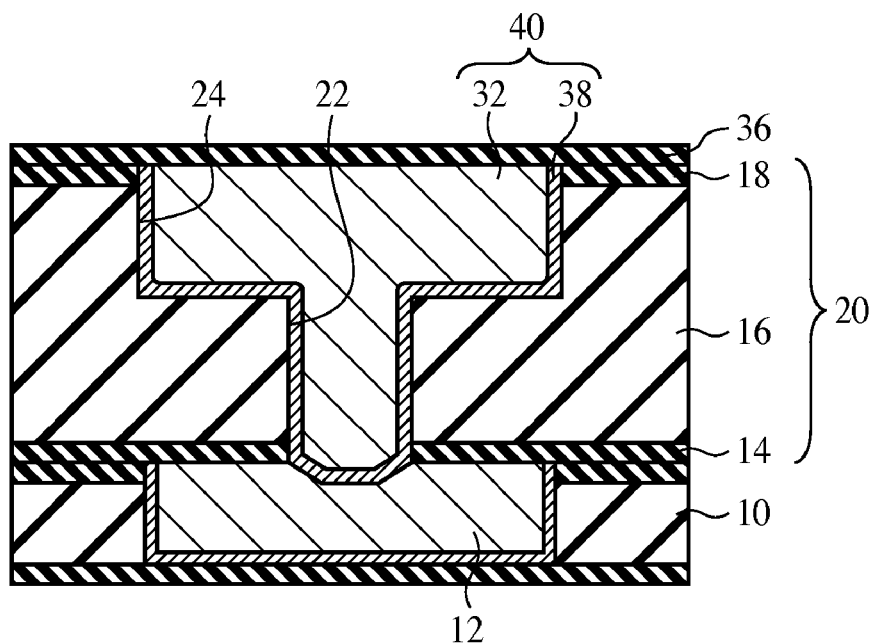
Figure 6A:
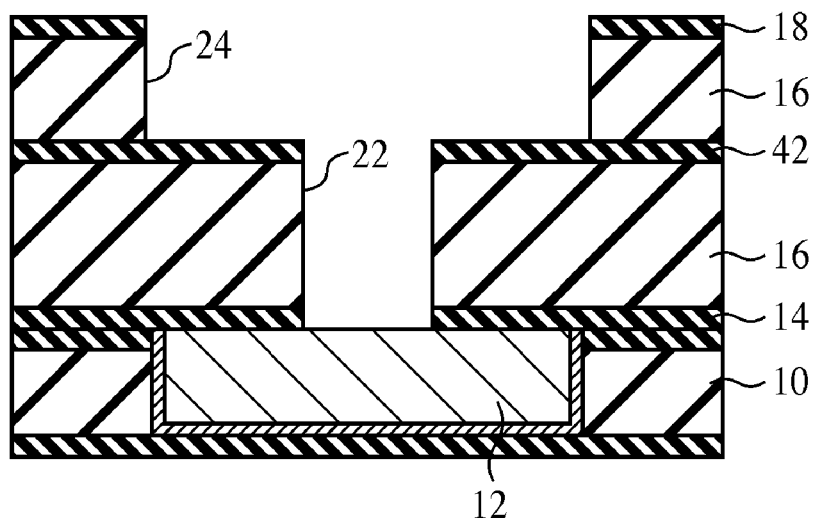
FIGS. 6A and 6B are cross-sectional views illustrating a method of manufacturing the semiconductor device according to modifications of the first embodiment.
Figure 6B:
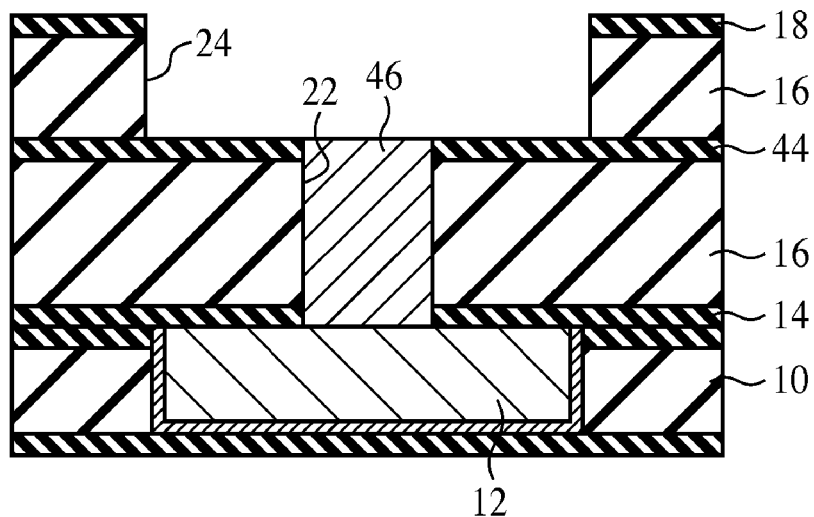

FIG. 1 is a diagrammatic cross-sectional view illustrating the structure of the semiconductor device according to the present embodiment. FIGS. 2A-5B are cross-sectional views illustrating the method of manufacturing the semiconductor device according to the present embodiment. FIGS. 6A and 6B are cross-sectional views illustrating the method of manufacturing the semiconductor device according to the modifications of the present embodiment.

First, the structure of the semiconductor device according to the present embodiment will be described with reference to FIG. 1.

An inter-layer insulating film 10 with an interconnection layer 12 buried in is formed above a substrate not illustrated. Above the inter-layer insulating film 10 with the interconnection layer 12 buried in, an inter-layer insulating film 20 including a barrier layer 14, a low dielectric constant insulating film 16 and an etching stopper film 18 is formed. In the inter-layer insulating film 20, via-hole 22 arriving at the interconnection layer 12 and interconnection trench 24 connected to the via-hole 22 are formed.

Above the inside walls and the bottoms of the via-hole 22 and the interconnection trench 24, a barrier layer 38 including a first metal material which can independently exhibit barrier ability to copper, a second metal material which tends to bond with oxygen and exhibits barrier ability to copper by bonding with oxygen, and oxygen is formed. In the via-hole 22 and the interconnection trench 24 with the barrier layer 38 formed on, an interconnection material 32 of copper as the main material is buried. Thus, in the via-hole 22 and the interconnection trench 24, an interconnection layer 40 including the barrier layer 38 and the interconnection material 32 and connected to the interconnection layer 12 via the via-hole 22 is formed.

Above the inter-layer insulating film 20 with the interconnection layer 40 buried in, an etching stopper film 36 which is a part of an inter-layer insulating film (not illustrated) to be formed thereon is formed.

As described above, in the semiconductor device of the present embodiment, the barrier layer 30 of the interconnection layer 40 is formed of a material including a first metal material, a second metal material and oxygen.

Here, the first metal material is a material which independently exhibit barrier ability to copper, and is a refractory metal material containing at least one kind of metal element selected from the group including tantalum (Ta), titanium (Ti), cobalt (Co), zirconium (Zr) and ruthenium (Ru). The second metal material is a material which tends to bond with oxygen and exhibits barrier ability to copper by bonding with oxygen, and is a metal material containing at least one kind of metal element selected from the group including manganese (Mn), titanium (Ti) and aluminum (Al). That is, the constituent material of the barrier layer 38 can be TaMnO, TiMnO, CoMnO, ZrMnO, RuMnO, TaAlO, TiAlO, CoAlO, ZrAlO, TaTiO, CoTiO, ZrTiO, RuTiO, RuAlO and their mixtures.

Next, the method of manufacturing the semiconductor device according to the present embodiment will be described with reference to FIGS. 2A to 5B.

Above the substrate not illustrated, the inter-layer insulating film 10 with the interconnection layer 12 buried in is formed. The substrate here is a semiconductor substrate itself and also covers the substrate with elements, such as transistors, etc., and one or more interconnection layers formed on. In this specification, the substrate including the inter-layer insulating film 10 is often called the substrate. The interconnection layer 12 is not especially limited but can be an interconnection layer of copper as the main material, and in this case, the interconnection layer 12 may be formed by the same process to be described below.

Then, the cap film 14 is formed above the inter-layer insulating film 10 with the interconnection layer 12 buried in.

The cap film 14 is mainly for preventing the constituent material of the interconnection layer 12 from diffusing into the inter-layer insulating film. The cap film 14 can be formed of, e.g., TEOS oxide film (SiO) by PECVD (Plasma Enhanced Chemical Vapor Deposition) with tetra ethyl ortho silicate (TEOS) as the raw material. Otherwise, the cap film 14 can be formed of silicon carbide (SiC), silicon oxycarbide (SiOC), silicon oxynitride (SiON), silicon nitrocarbide (SiCN), silicon nitride (SiN) or others by PECVD with organo silane based material or silane gas as the raw material.

SiC film of, e.g., a 30 nm-thickness is deposited by, e.g., PECVD method here to form the cap film 14 of SiC film. The SiC film can be formed by PECVD method with, e.g., tetramethylsilane (4MS) as the raw material at a substrate temperature of 300° C.-450° C., e.g., 400° C.

Next, above the cap film 14, the insulating film 16, which forms the major part of the inter-layer insulating film 20, is formed.

The insulating film 16 can be formed of silicon oxide (SiO) film formed by PECVD method or thermal CVD method with the TEOS or silane gas as the raw material, an inorganic or organic low dielectric constant film so called low-k film formed by PECVD method or coating method, or others. The inorganic low dielectric constant film can be low dielectric constant film, such as silicon oxycarbide (SiOC) or others, formed of the organo silane based material, organo siloxane based material film, siloxane hydride based material film, nanoclustering silica film of the porous silica based material, or others. The organo siloxane based material can be tetramethylcyclotetrasiloxane (TMCTS), octamethylcyclotetrasiloxane (OMCTS), diethoxymethylsilane (DEMS), dimethyldimethoxysilane (DMDMOS), trimethylmethoxysilane (TM-MOS), or others. The organic low dielectric constant film can be aromatic polyether film, e.g., "SiLK" (registered trademark) from The Dow Chemical Company, "FLARE" (registered trademark) from Honeywell Electronic Materials Inc., or others.

The insulating film 16 of an SiOC film is formed here by depositing the SiOC film of, e.g., a 300 nm-thickness by, e.g., PECVD method. The SiOC film can be formed by using, e.g., TM-MOS as the raw material and at 300° C.-450° C. substrate temperature, e.g., 350° C.

Then, above the insulating film 15, the etching stopper film 18 is formed.

The etching stopper film 18 is formed of a material having etching selectivity for the upper and/or the lower insulating film. The etching stopper film 18 can be SiC film or SiN film formed by PECVD method, or others.

The etching stopper film 18 of an SiC film is formed here by depositing the SiC film of, e.g., a 30 nm-thickness by, e.g., PECVD method. The SiC film is formed by using, e.g., 4MS as the raw material and at 350° C.-400° C. substrate temperature, e.g., 400° C.

Figure 2A:
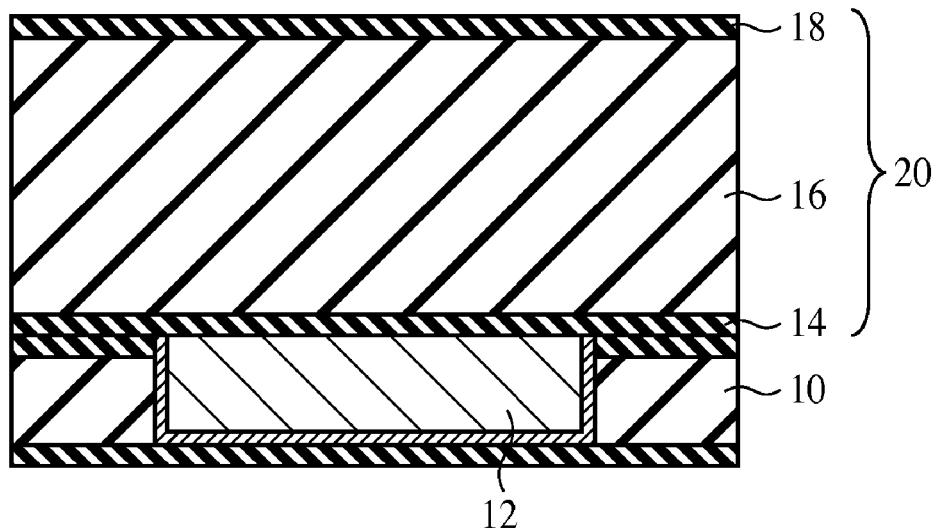
FIGS. 2A-2B, 3A-3B, 4A-4B and 5A-5B are cross-sectional views illustrating a method of manufacturing the semiconductor device according to the first embodiment.

Thus, above the inter-layer insulating film 10 with the interconnection layer 12 buried in, the inter-layer insulating film 20 including the cap film 14, the insulating film 16 and the etching stopper film 18 is formed (FIG. 2A).

Figure 2B:
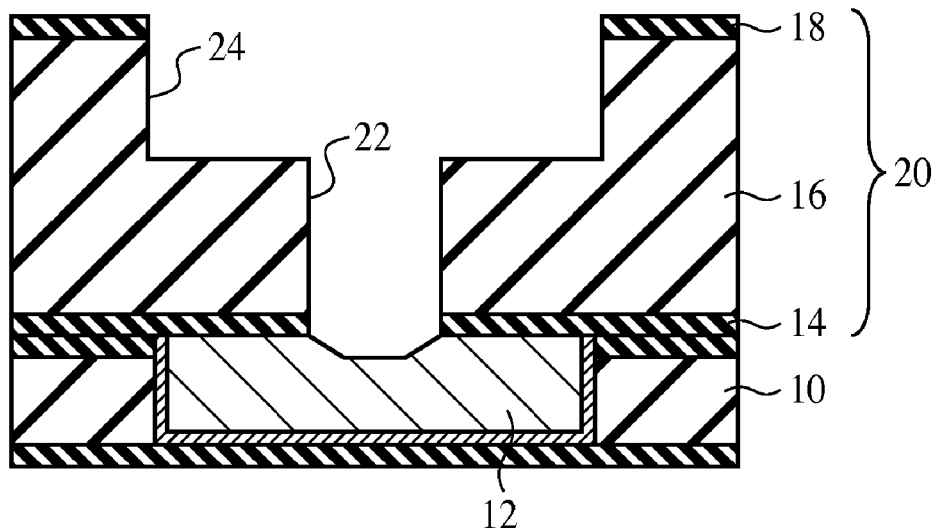

Then, by photolithography and dry etching, the via-hole 22 to be connected to the interconnection layer 12, and the interconnection trench 24 to be connected to via-hole 22 are formed in the inter-layer insulating film 20 (FIG. 2B). The width of the interconnection trench 24 is not especially limited but is, e.g., 50 nm-30000 nm. The diameter of the via-hole 22 is not especially limited but is, e.g., 70 nm. The height of the via-hole 22 is not especially limited but is, e.g., 150 nm.

The via-hole 22 and the interconnection trench 24 may be formed by the general dual damascene process. At the intermediate part of the insulating film 16, an intermediate stopper layer for stopping the etching for the interconnection trench 24 may be provided.

Figure 3A:
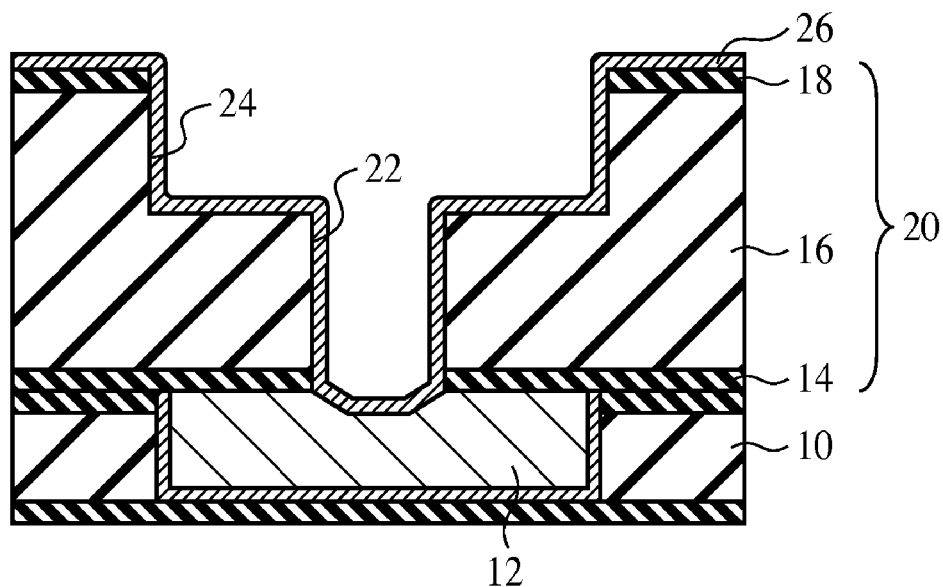

Then, the barrier layer 26 is formed above the inter-layer insulating film 20 and above the side walls and the bottoms of via-hole 22 and the interconnection trench 24 by, e.g., PVD method or CVD method (FIG. 3A). The barrier layer 26 is formed of a refractory metal material including at least one kind of metal element selected out of the groups including Ta, Ti, Co, Zr and Ru. The barrier layer 26 may be a single layer structure or a multilayer structure. For example, the multilayer structure may be a multilayer structure of a metal layer and a nitride film of a metal element, e.g., Ta/TaN, Ti/TiN, a multilayer structure of metal layers, e.g., Co/Ta, Co/Ti, Co/Ru, Ru/Ta, or others.

The barrier layer 26 of a Ta film is formed here by depositing the Ta film of, e.g., a 3 nm-10 nm-thickness by, e.g. sputtering method. The film forming conditions of the Ta film are a discharge gas of, e.g., argon (Ar) or nitrogen ($N_2$), and a target loading power of, e.g. 160 mW/mm$^2$-640 mW/mm$^2$.

Figure 3B:
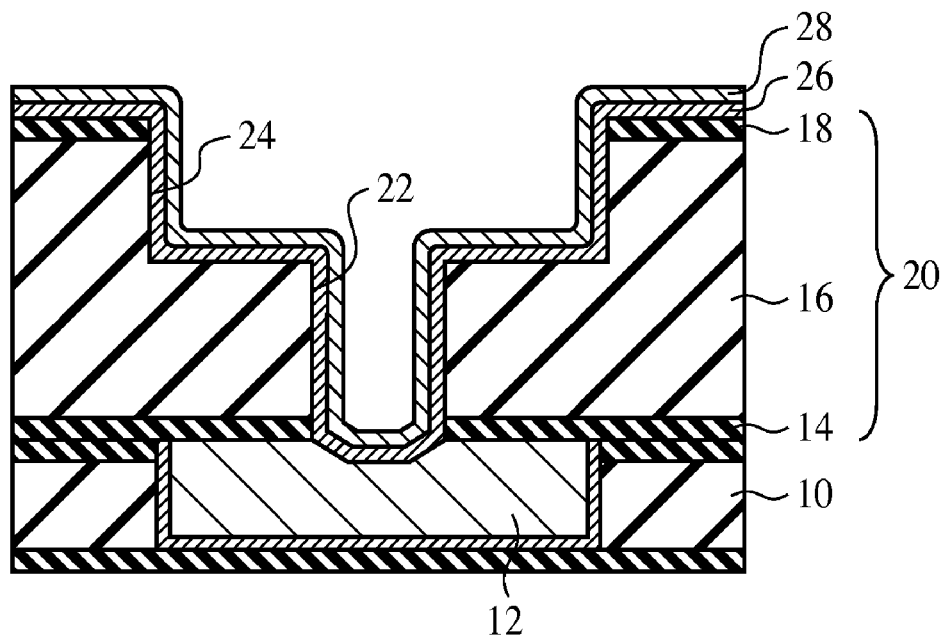

Then, above the barrier layer 26, a copper layer containing oxygen (hereinafter called "an oxygen-contained copper layer") 28 is formed by, e.g., sputtering method (FIG. 3B). The conditions for forming the oxygen-contained copper layer 28 are a discharge gas of, e.g., Ar with oxygen ($O_2$) added and a copper target loading power of, e.g., 160 mW/mm$^2$-640 mW/mm$^2$.

The oxygen content of the oxygen-contained copper layer 28 is preferably $1 \times 10^{20}$ atoms/cm$^3$-$1 \times 10^{22}$ atoms/cm$^3$. The oxygen content is not less than $1 \times 10^{20}$ atoms/cm$^3$ because the oxygen content of below $1 \times 10^{20}$ atoms/cm$^3$ cannot make the sufficient effect of adding oxygen. The oxygen content is not more than $1 \times 10^{22}$ atoms/cm$^3$ because when excessive oxygen which has not contributed to the formation of the barrier layer 38 in the interconnection layer 40, the increase of the resistance of the interconnection layer 40 and the contact resistance to the interconnection layer 12 can be prevented. The average oxygen concentration in the general copper interconnection formed by using pure copper seed or copper plating is about $1 \times 10^{18}$ atoms/cm$^3$-$1 \times 10^{21}$ atoms/cm$^3$, and the effect of such oxygen content on the resistance and contact resistance of the interconnection layer is sufficiently small.

The oxygen-contained copper layer 28 has preferably a film thickness, which makes the oxygen content equivalent to or more than a quantity of a second metal material contained in the alloy layer 30 to be formed at the bottom of the interconnection trench 24 of a maximum interconnection width when the alloy layer 30 to be described later is formed. In terms of this, the film thickness of the oxygen-contained copper layer 28 is at least not less than 0.5 nm, preferably 0.5 nm-5 nm. Thus, in the thermal processing for forming the barrier layer 38, the second metal material in the alloy layer 30 and the oxygen in the oxygen-contained copper layer 28 react with each other, and the second metal material can be efficiently consumed, whereby the concentration of the second metal material residing in the interconnection material 32 can be decreased.

When the metal oxide layer, e.g., a copper oxide material is used as the oxygen-contained copper layer 28, there is a risk that the contact resistance increase and adhesion decrease would take place. The oxygen-contained copper layer 28 is preferably a copper layer containing oxygen in the film.

Preferably, the oxygen-contained copper layer 28 is formed continuously without being exposed to the atmospheric environmental after the barrier layer has been formed. This is because when the oxygen-contained copper layer 28 is exposed to the atmospheric environment after the barrier layer 26 has been formed, there is a risk that the adhesion between the reaction compound layer and the conduction part would be lowered, and the reliability would be degraded.

Figure 4A:
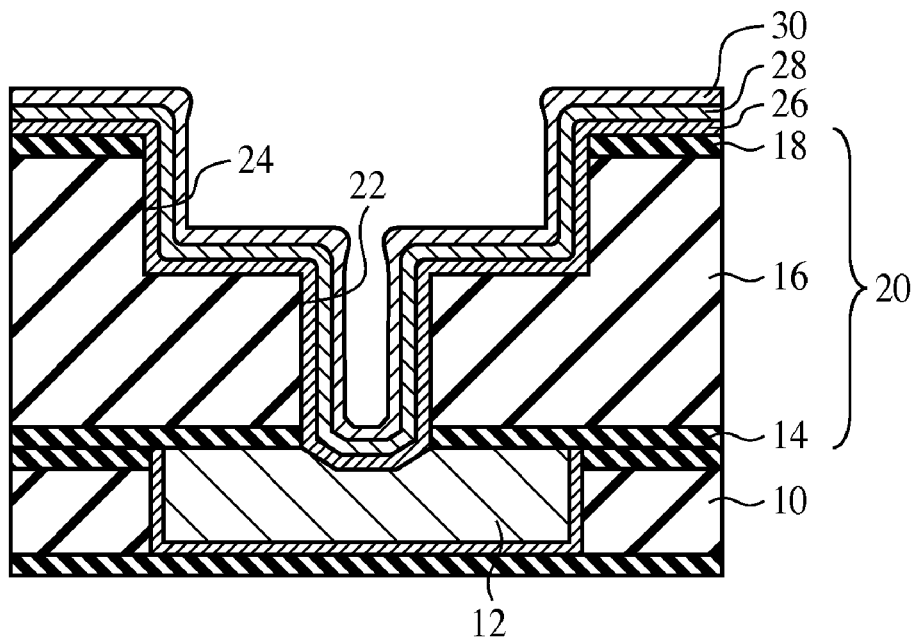

Then, above the oxygen-contained copper layer 28, the alloy layer 30 containing Cu and the second metal material is formed by, PVD method or CVD method (FIG. 4A). The alloy layer 30 can be, e.g., CuMn, CuTi, CuAl or others.

As the alloy layer 30, a CuMn layer of, e.g., a 0.5 nm-60 nm-thickness is formed here. The CuMn layer is formed by, e.g., sputtering method using the copper target containing Mn by 0.1 atom %-10 atom %, Ar as the discharge gas, the target loading power of, e.g., 160 mW/nm$^2$-640 mW/mm$^2$ and the chamber pressure of, e.g., $10^{-5}$ Pa-10 Pa. At this time, a bias power of 5 mW/mm$^2$-15 mW/mm$^2$ may be applied to the substrate.

Figure 4B:
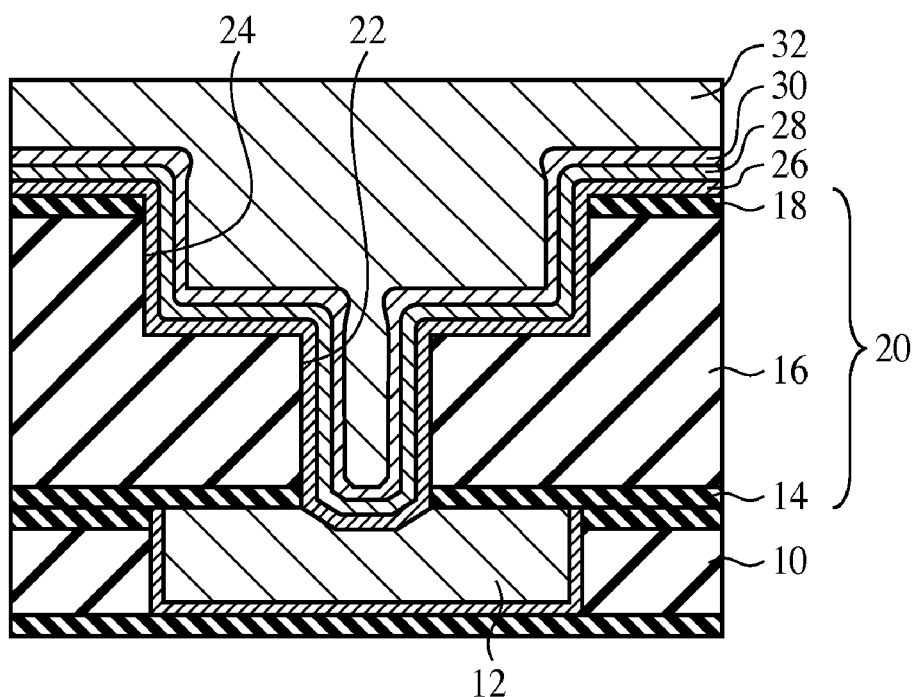

Then, above the alloy layer 30, the interconnection material 32 of, e.g., a 500 nm-thickness formed of Cu as the main material is formed, filling the via-hole 22 and the interconnection trench 24 (FIG. 4B).

The interconnection material 32 can be formed by, e.g., electrolytic copper plating method. In this case, copper film which is to be the electrode for the copper plating (not illustrated) may be formed above the alloy layer 30 in advance. The interconnection material 32 is formed in, e.g., a 200 nm-5000 nm by using a copper sulfate solution bath adjusted in a required concentration and at the current density of, e.g., 3 mA/cm$^2$-55 mA/cm$^2$.

The interconnection material 32 can be formed also by CVD method using, e.g., Cu(hfac)TMVS (trimethylvinylsilyl hexafluoroacetylacetonate Cu(I)). As the film forming conditions for this case, for example, the flow rate of the main raw material can be 0.3 g/min-0.5 g/min; the flow rate of $H_2$/He gas as the carrier gas, 600 sccm; the substrate temperature, 160° C.-200° C.; and the film forming pressure, 150 Pa-800 Pa.

Then, to stabilize the crystallization of the interconnection material 32, thermal processing is made in a $H_2$/$N_2$ atmosphere, at 150° C.-350° C. temperature, e.g., 250° C. and for 90 seconds-90 minutes, e.g., 90 seconds.

Next, those of the interconnection material 32, the alloy layer 30, the oxygen-contained copper layer 28 and the barrier layer 26 above the inter-layer insulating film 20, which are excessive are removed by CMP (Chemical Mechanical Polishing) method. Thus, the interconnection layer 34 connected to the interconnection layer 12 via the via-hole 22 and formed of the interconnection material 32, the alloy layer 30, the oxygen-contained copper layer 28 and the barrier layer 26 buried in the via-hole 22 and the interconnection trenches 24 is formed (FIG. 5A).

Then, the cap film 36 is formed above the inter-layer insulating film 20 with the interconnection layer 34 buried in.

The cap film 36 is mainly for preventing the diffusion of the constituent material of the interconnection layer 34 into the inter-layer insulating film 20, as is the cap film 14. The cap film 36 may be formed also of SiOC, SiON, SiC, SiN or others.

The cap film 34 of an SiC film is formed here by depositing the SiC film of, e.g., a 30 nm-thickness by, e.g., PECVD method. The SiC film is formed by, e.g. PECVD method using 4MS as the raw material and $CO_2$ as the carrier gas and at 300° C.-450° C. substrate temperature, e.g., 400° C.

Then, thermal processing of about 300° C.-450° C., e.g., 400° C. is made. By this thermal processing, the second metal material contained in the alloy layer 30 is diffused in the interconnection layer 34 to form a compound layer (the barrier layer 38) containing the first metal material, the second metal material and oxygen at the interface between the interconnection layer and the inter-layer insulating film 20. Thus, the interconnection layer 34 containing the interconnection material 32, the alloy layer 30, the oxygen-contained copper layer 28 and the barrier layer 26 becomes the interconnection layer 40 including the barrier layer 38 and the interconnection material 32 (FIG. 5B).

The barrier film 38 is formed by the reaction among the barrier layer 26, the oxygen-contained copper layer 28 and the alloy layer 30 and is the compound layer containing the first metal material, the second metal material and oxygen. For example, in the above-described example, where the barrier layer 26 of Ta as the first metal material and the alloy layer 30 of CuMn containing Mn as the second metal material, the barrier layer 38 of TaMnO is formed.

In the reaction for forming the barrier layer 38, oxygen is often fed from the inter-layer insulating film (e.g., the insulating film 16). The barrier layer 38 often contains silicon (Si) which is the constituent material of the inter-layer insulating film 20.

The thermal processing for forming the barrier layer 38 may be made in a separate additional thermal processing step or may be made by utilizing the heat loading of 400° C. made in the backend process. In the above-described manufacturing method, for example, the heat loading of 400° C. in forming the cap film 36 can be utilized. The thermal processing for forming the barrier layer 38 may be made before the polishing by CMP method as long as the interconnection material 32 has been deposited.

Then, required backend process is made, and the semiconductor device according to the present embodiment is completed.

As described above, in the method of manufacturing the semiconductor device according to the present embodiment, the oxygen-contained copper layer 28 and the alloy layer 30 are formed between the barrier layer 26 and the interconnection material 32. Whereby even when parts where the barrier ability is degraded due to poor coverage of the barrier layer 26 are present, the second metal material in the alloy layer 30 and the oxygen in the oxygen-contained copper layer 28 react with each other at the parts, and a compound of high barrier ability to copper can be formed by self-restore. Thus, the lowered barrier ability of the barrier layer 26 can be compensated, and the reliability of the interconnection can be improved.

Because of the oxygen-contained copper layer 28 formed, the second metal material in the alloy layer 30 can be efficiently consumed when the barrier layer 38 is formed, whereby the resistance increase of the interconnection layer 40 and the increase of the contact resistance to the interconnection layer 12 due to the residual second metal material in the interconnection material 32 can be suppressed. Especially, the oxygen content in the oxygen-contained copper layer 28 is made equivalent or more than a quantity of the second metal material contained in the alloy layer 30 formed at the bottom of the interconnection trenches 24 having a maximum interconnection width, whereby the concentration of the second metal material residing in the interconnection material 32 after the barrier layer 38 has been formed can be drastically decreased.

The formation of the oxygen-contained copper layer 28 is especially effective when the cap film or the etching stopper film are exposed on the bottom of the interconnection trench 24.

For example, in the dual damascene process using the intermediate stopper layer, as exemplified in FIG. 6A, the etching stopper film 42 is exposed on the bottom of the interconnection trench 24. In the single damascene process, as exemplified in FIG. 6B, the cap film 44 is exposed on the bottom of the interconnection trench 24. The etching stopper film 42 and the cap film 42 are, in many cases, formed of insulating film whose oxygen content is small, such as SiC film, SiN film or others. In this case, unless the oxygen-contained copper layer 28 is present, oxygen is fed to the side walls of the interconnection trenches 24 from the insulating film 16, but at the bottoms of the interconnection trench 24, oxygen cannot be sufficiently fed from the lower inter-layer insulating film when the barrier layer 38 is formed, and the second metal material contained in the alloy layer 30 cannot be efficiently consumed. Resultantly, the concentration of the second metal material residing in the interconnection material 32 after the barrier layer 38 has been formed increases, which leads to the increase of the resistance and the contact resistance of the interconnection layer 40.

The oxygen-contained copper film 28 is provided between the barrier layer 26 and the alloy layer 30, whereby even when the etching stopper film 42 or the cap film 44 are exposed on the bottom of the interconnection trench 24, the second metal material in the alloy layer 30 can be efficiently consumed by the oxygen in the oxygen-contained copper layer 28. Thus, the concentration of the second metal material residing in the interconnection material 32 can be drastically decreased.

The effect of forming the oxygen-contained copper layer 28 is conspicuous on the interconnection layer whose line width is large.

The reaction of forming the barrier layer 38 is influenced by structures of semiconductor devices, kinds of the insulating film on the side walls and the bottoms of the trenches, load quantities of the second metal material, reaction temperatures, etc. Basically, the reaction most tends to take place at the side walls of the small width trenches where the oxidation of the first metal material by the inter-layer insulating film (the insulating film 16) tends to take place, and relatively less tends to take place as the line width increases.

In the interconnection layer having a large line width, the film thickness of the alloy layer 30 deposited on the bottom of the interconnection trench tends to be larger than in the interconnection layer having a smaller line width due to the aspect ratio difference. When PVD method, such as sputtering method or others, is used, the film is formed relatively thinner on the side walls of the interconnection trench 24 than on the bottom thereof, and the reaction of forming the barrier layer 38 more tends to take place as the line width is smaller. These mean that the quantity of the second metal material to be deposited on the bottom region of the interconnection trench 24 increases in the interconnection layer of a larger line width, and the influence on the resistance and the contact resistance of the interconnection layer 40 is larger. The oxygen-contained copper layer 28 is formed, whereby even in the interconnection layer of a large line width, the concentration of the second metal material residing in the interconnection material 32 after the barrier layer 38 has been formed can be efficiently decreased.

As described above, according to the present embodiment, the oxygen-contained copper layer 28 is formed between the barrier layer 26 containing the first metal material and the alloy layer 30 containing the second metal material, whereby the second metal material and oxygen can be efficiently bonded, and the formation of the barrier layer 38 can be accelerated. Thus, the concentration of the second metal material residing in the interconnection layer 40 can be decreased, and the increase of the resistance and the contact resistance of the interconnection layer 40 can be prevented. The barrier layer 38 can be formed by self-restore between the interconnection layer 40 and the insulating film 20, and the reliability of the semiconductor device can be improved.

A Second Embodiment

A method of manufacturing a semiconductor device according to a second embodiment will be described with reference to FIGS. 2A to 5B. The same members of the present embodiment as those of the method of manufacturing the semiconductor device according to the first embodiment are represented by the same reference numbers not to repeat or to simplify their description.

The method of manufacturing the semiconductor device according to the present embodiment is the same as the method of manufacturing the semiconductor device according to the first embodiment except that the process of forming the oxygen-contained copper layer 28 is different.

First, in the same way as in the method of manufacturing the semiconductor device according to the first embodiment, the via-hole 22 and the interconnection trench 24 are formed in the inter-layer insulating film 20 (see FIGS. 2A and 2B).

Then, in the same way as in the method of manufacturing the semiconductor device according to the first embodiment, the barrier layer 26 is formed above the inter-layer insulating film 20, and above the side walls and the bottoms of the via-hole 22 and the interconnection trench 24 by, e.g., PVD method or CVD method (see FIG. 3A).

Next, above the barrier layer 26, the oxygen-contained copper layer 28 is formed by, e.g., CVD method (see FIG. 3B). As the conditions for forming the oxygen-contained copper film 28, for example, the main raw material is, e.g., Cu(hfac)TMVS; the flow rate of the main raw material, e.g., 0.05 g/min-0.2 g/min; the flow rate of an $H_2$/He mixed gas as the carrier gas, e.g., 600 sccm; the substrate temperature, e.g., 170° C.; and the film forming pressure, e.g., 150 Pa. The deposition is made with the deposition rate lowered at the low temperature, whereby oxygen can be contained in the copper film.

The oxygen content of the oxygen-contained copper film 28 and the film thickness of the oxygen-contained copper layer 28 are the same as in the first embodiment.

In forming the oxygen-contained copper layer 28 by CVD, Cu(hfac)TMVS is used as the raw material here, but as long as the copper layer containing a required quantity of oxygen can be formed, other known materials and conditions may be used.

Preferably, the oxygen-contained copper layer 28 is formed continuously after the barrier layer 26 has been formed without being exposed to the atmosphere.

Next, in the same way as in the method of manufacturing the semiconductor device according to the first embodiment, the alloy layer 30 containing Cu and the second metal material is formed above the oxygen-contained copper layer 28 by, e.g., PVD method or CVD method (see FIG. 4A).

Then, in the same way as in the method of manufacturing the semiconductor device according to the first embodiment, above the alloy layer 30, the interconnection material 32 is formed, filling the via-hole 22 and the interconnection trench 24 (see FIG. 4B).

Then, in the same way as in the method of manufacturing the semiconductor device according to the first embodiment, thermal processing for stabilizing the crystals of the interconnection material 32 is made.

Next, in the same way as in the method of manufacturing the semiconductor device according to the first embodiment, those of the interconnection material 32, the alloy layer 30, the oxygen-contained copper layer 28 and the barrier layer 26 above the inter-layer insulating film 20, which are excessive are removed by CMP method, and the interconnection layer 34 is formed (see FIG. 5A).

Next, in the same way as in the method of manufacturing the semiconductor device according to the first embodiment, the cap film 36 is formed above the inter-layer insulating film 20 with the interconnection layer 34 buried in.

Hereafter, in the same way as in the method of manufacturing the semiconductor device according to the first embodiment, thermal processing for forming the barrier layer 38 is made, and the interconnection layer 40 including the barrier layer 38 and the interconnection material 32 is formed (see FIG. 5B).

Then, required backend process is made, and the semiconductor device according to the present embodiment is completed.

As described above, according to the present embodiment, the oxygen-contained copper layer 28 is formed between the barrier layer 26 containing the first metal material and the alloy layer 30 containing the second metal material, whereby the second metal material and oxygen can be efficiently bonded, and the formation of the barrier layer 38 can be accelerated. Thus, the concentration of the second metal material residing in the interconnection layer 40 can be decreased, and the increase of the resistance and the contact resistance of the interconnection layer 40 can be prevented. The barrier layer 38 can be formed by self-restore between the interconnection layer 40 and the insulating film 20, and the reliability of the semiconductor device can be improved.

A Third Embodiment

A method of manufacturing a semiconductor device according to a third embodiment will be described with reference to FIGS. 7A-7B. The same members of the present embodiment as those of the method of manufacturing the semiconductor device according to the first and the second embodiments are represented by the same reference numbers not to repeat or to simplify their description.

Figure 7A:
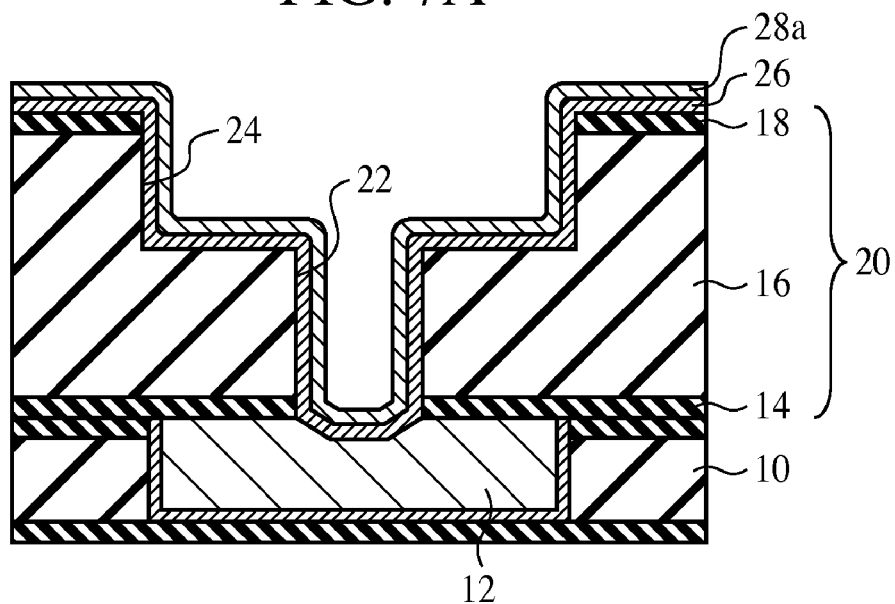
FIGS. 7A and 7B are cross-sectional views illustrating a method of manufacturing the semiconductor device according to a third embodiment.
Figure 7B:
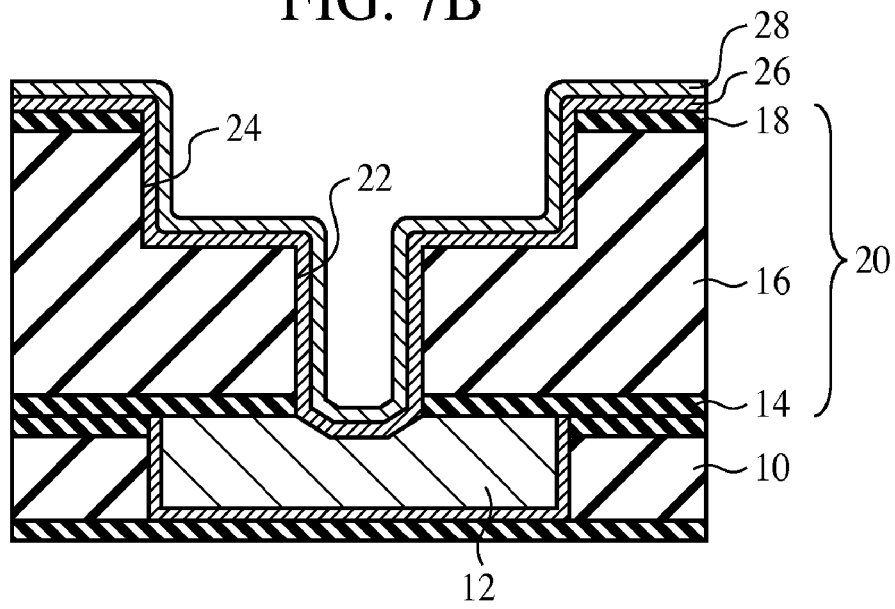

FIGS. 7A and 7B are cross-sectional views illustrating the method of manufacturing the semiconductor device according to the present embodiment.

The method of manufacturing the semiconductor device according to the present embodiment is the same as the method of manufacturing the semiconductor device according to the first embodiment except that the process of forming the oxygen-contained copper layer 28 is different.

First, in the same way as in the method of manufacturing the semiconductor device according to the first embodiment, the via-hole 22 and the interconnection trench 24 are formed in the inter-layer insulating film 20 (see FIGS. 2A and 2B).

Then, in the same way as in the method of manufacturing the semiconductor device according to the first embodiment, the barrier layer 26 is formed above the inter-layer insulating film 20 and above the side walls and the bottoms of the via-hole 22 and the interconnection trench 24 by, e.g., PVD method or CVD method (see FIG. 3A).

Next, the copper layer 28a of, e.g., a 0.5 nm-5 nm-thickness is formed above the barrier layer 26 by, e.g., sputtering method or CVD method (FIG. 7A).

The conditions for forming the copper layer 28a by sputtering method are, e.g., a copper target, Ar, for example, as the discharge gas, a copper target loading power of, e.g., 160 mW/mm$^2$-640 mW/mm$^2$, and a chamber pressure of, e.g., $10^{-5}$ Pa-10 Pa. At this time, a bias power of 5 mW/mm$^2$-15 mW/mm$^2$ may be applied to the substrate.

The conditions for forming the copper layer 28a by CVD method are, e.g., Cu(hfac)TMVS, for example, as the main raw material, a flow rate of the main raw material of, e.g., 0.3 g/min, a flow rate of H$_2$/He mixed gas as the carrier gas of, e.g., 600 sccm, a substrate temperature of, e.g., 180° C., and a film forming pressure of, e.g., 100 Pa. The oxygen content of the copper layer 28a formed under these conditions are about $3\times10^{18}$ cm$^{-3}$.

To form the copper layer 28a by CVD method, Cu(hfac)TMVS as the raw material is used here, but other known materials and conditions may be used.

Preferably, the copper layer 28a is formed continuously after the barrier layer 26 has been formed without being exposed to the atmosphere.

Then, the surface side of the copper layer 28a is oxidized thin to form the oxygen-contained copper layer 28 (FIG. 7B). The oxygen-contained copper layer 28 can be formed, e.g., by the oxidation using oxygen gas as the oxidizing agent at a temperature lower than 200° C. For example, thermal processing of 80° C.-150° C. is made in a low pressure atmosphere containing oxygen established in the processing chamber.

The oxygen content of the oxygen-contained copper layer 28 is the same as in the first embodiment.

Preferably, the oxidation of the copper layer 28a is made continuously after the copper layer 28a has been formed without being exposed to the atmosphere.

Next, in the same way as in the method of manufacturing the semiconductor device according to the first embodiment, the alloy layer 30 containing Cu and the second metal material is formed above the oxygen-contained copper layer 28 by, e.g., PVD method or CVD method (see FIG. 4A).

Then, in the same way as in the method of manufacturing the semiconductor device according to the first embodiment, the interconnection material 32 is formed, above the alloy layer 30, filling the via-hole 22 and the interconnection trench 24 (see FIG. 4B).

Then, in the same way as in the method of manufacturing the semiconductor device according to the first embodiment, thermal processing stabilizing the crystals of the interconnection material 32 is made.

Next, in the same way as in the method of manufacturing the semiconductor device according to the first embodiment, those of the interconnection material 32, the alloy layer 30, the oxygen-contained copper layer and the barrier layer 26 above the inter-layer insulating film 20, which are excessive are removed by CMP method, and the interconnection layer 34 is formed (see FIG. 5A).

Next, in the same way as in the method of manufacturing the semiconductor device according to the first embodiment, the cap film 36 is formed above the inter-layer insulating film 20 with the interconnection layer 34 buried in.

Then, in the same way as in the method of manufacturing the semiconductor device according to the first embodiment, thermal processing for forming the barrier layer 38 is made to form the interconnection layer 40 including the barrier layer 38 and the interconnection material 32 (see FIG. 5B).

Then, required backend process is made, and the semiconductor device according to the present embodiment is completed.

As described above, according to the present embodiment, the oxygen-contained copper layer 28 is formed between the barrier layer 26 containing the first metal material and the alloy layer 30 containing the second metal material, whereby the second metal material and oxygen can be efficiently bonded, and the formation of the barrier layer 38 can be accelerated. Thus, the concentration of the second metal material residing in the interconnection layer 40 can be decreased, and the increase of the resistance and the contact resistance of the interconnection layer 40 can be prevented. The barrier layer 38 can be formed by self-restore between the interconnection layer 40 and the insulating film 20, and the reliability of the semiconductor device can be improved.

Modified Embodiments

The above-described embodiments can cover other various modifications.

For example, in the above-described embodiments, the interconnection layer 40 is formed by dual damascene process but may be formed by single damascene process.

In the above-described embodiments, the insulating film 16 is formed of SiOC film, but the material forming the insulating film 16 is not limited to SiOC film. In terms of accelerating the formation of the barrier layer 38, a material containing oxygen is preferable. In terms of the conformity with the semiconductor device process, a silicon-based insulating material is preferable. In this specification, the silicon-based insulating material is, e.g., silicon oxide, silicon nitride, silicon carbide, silicon oxynitride, silicon oxycarbide, silicon nitrocarbide or others, or an insulating film containing at least one of them.

In the above-described embodiments, the first metal material is exemplified by a material containing at least one kind of element selected from the group including Ta, Ti, Co, Zr and Ru, and the second metal material is exemplified by a material containing at least one kind of element selected from the group including Mn, Ti and Al. However, other materials having the same properties as those of them may be used.

The manufacturing conditions described in the above-described embodiments are those suitable for the systems used by the inventors of the present application. The described manufacturing method is not limited to the manufacturing conditions described in the above-described embodiments and can be suitably modified within the range where the advantageous effects of the present invention can be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
   forming an insulating film above a semiconductor substrate;
   forming an opening in the insulating film;
   forming a first film containing a first metal material containing at least one kind of an element selected from the group consisting of Ta, Ti, Co, Zr and Ru above an inside wall and a bottom of the opening in the insulating film;
   forming a second film including an oxygen-contained copper film above the first film;
   forming a third film containing copper and a second metal material containing at least one kind of an element selected from the group consisting of Mn, Ti and Al above the second film;
   forming above the third film a fourth film containing copper, filling the opening with the first film, the second film and the third film formed in; and
   removing the fourth film, the third film, the second film and the first film above the insulating film to form an interconnection layer buried in the opening, and
   further comprising after forming the fourth film, forming a barrier layer containing the first metal material, the second metal material and oxygen between the insulating film and the fourth film by thermal processing.

2. The method of manufacturing a semiconductor device according to claim 1, wherein
   forming the third film includes forming a copper film and oxidizing a surface of the copper film.

3. The method of manufacturing a semiconductor device according to claim 1, wherein
   an oxygen concentration in the third film is $1.0 \times 10^{20}$ atoms/cm$^3$ to $1.0 \times 10^{22}$ atoms/cm$^3$.

4. The method of manufacturing a semiconductor device according to claim 1, wherein
   in forming the barrier layer, the thermal processing is made at not less than 300° C.

5. The method of manufacturing a semiconductor device according to claim 1, wherein
   the insulating film includes silicon-based insulating film containing oxygen.

6. A method of manufacturing a semiconductor device comprising:
   forming an insulating film above a semiconductor substrate;
   forming an opening in the insulating film;
   forming a first film containing a first metal material having a diffusion preventing function for copper above an inside wall and a bottom of the opening in the insulating film;
   forming a second film including an oxygen-contained copper film above the first film;
   forming a third film containing copper and a second metal material which exhibits a diffusion preventing function for copper by bonding with oxygen above the second film;
   forming above the third film a fourth film containing copper, filling the opening with the first film, the second film and the third film formed in; and
   removing the fourth film, the third film, the second film and the first film above the insulating film to form an interconnection layer buried in the opening, and
   further comprising after forming the fourth film, forming a barrier layer containing the first metal material, the second metal material and oxygen between the insulating film and the fourth film by thermal processing.

7. The method of manufacturing a semiconductor device according to claim 6, wherein
   forming the third film includes forming a copper film and oxidizing a surface of the copper film.

8. The method of manufacturing a semiconductor device according to claim 6, wherein
   an oxygen concentration in the third film is $1.0 \times 10^{20}$ atoms/cm$^3$ to $1.0 \times 10^{22}$ atoms/cm$^3$.

9. The method of manufacturing a semiconductor device according to claim 6, wherein
   in forming the barrier layer, the thermal processing is made at not less than 300° C.

10. The method of manufacturing a semiconductor device according to claim 6, wherein
    the insulating film includes silicon-based insulating film containing oxygen.

11. The method of manufacturing a semiconductor device according to claim 6, wherein
    the first metal material contains at least one kind of an element selected from the group consisting of Ta, Ti, Co, Zr and Ru.

12. The method of manufacturing a semiconductor device according to claim 6, wherein
    the second metal material contains at least one kind of an element selected from the group consisting of Mn, Ti and Al.

* * * * *